US009096044B2

(12) United States Patent
Chen et al.

(10) Patent No.: US 9,096,044 B2
(45) Date of Patent: Aug. 4, 2015

(54) FLEXIBLE DISPLAY PANEL AND METHOD OF FABRICATING THE SAME

(75) Inventors: Cheng-Chung Chen, Taichung (TW); Keh-Long Hwu, Hsinchu County (TW); Chih-Jen Hu, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 233 days.

(21) Appl. No.: 13/167,741

(22) Filed: Jun. 24, 2011

(65) Prior Publication Data
US 2011/0318544 A1 Dec. 29, 2011

(30) Foreign Application Priority Data

Jun. 24, 2010 (TW) ................. 99120612 A

(51) Int. Cl.
| | |
|---|---|
| G03G 7/00 | (2006.01) |
| B32B 9/04 | (2006.01) |
| B32B 9/00 | (2006.01) |
| B32B 37/02 | (2006.01) |
| H01L 27/00 | (2006.01) |
| H01L 51/00 | (2006.01) |
| H01L 29/66 | (2006.01) |
| B32B 38/00 | (2006.01) |
| G02F 1/1333 | (2006.01) |

(52) U.S. Cl.
CPC ............ B32B 37/02 (2013.01); *B32B 38/0004* (2013.01); *B32B 2310/0843* (2013.01); *B32B 2457/202* (2013.01); *B32B 2457/206* (2013.01); *G02F 1/133305* (2013.01); *G02F 2202/28* (2013.01); *H01L 27/00* (2013.01); *H01L 29/66* (2013.01); *H01L 51/00* (2013.01); *Y10T 428/24802* (2015.01)

(58) Field of Classification Search
USPC ............ 428/195.1, 411.1, 426, 446; 156/247; 438/22, 30
See application file for complete search history.

(56) References Cited

U.S. PATENT DOCUMENTS

| 8,222,808 | B2 * | 7/2012 | Kitazume et al. | ............. 313/504 |
| 2006/0220550 | A1 * | 10/2006 | Harada | ......................... 313/512 |
| 2007/0059854 | A1 * | 3/2007 | Huang et al. | .................... 438/30 |
| 2008/0223509 | A1 | 9/2008 | Kim et al. | |
| 2009/0047859 | A1 | 2/2009 | Kim et al. | |
| 2009/0266471 | A1 * | 10/2009 | Kim et al. | ...................... 156/67 |

FOREIGN PATENT DOCUMENTS

| CN | 101026090 | 8/2007 |
| TW | 200512090 | 4/2005 |
| TW | 200712607 | 4/2007 |

(Continued)

*Primary Examiner* — Mark Ruthkosky
*Assistant Examiner* — Laura C Powers
(74) *Attorney, Agent, or Firm* — Jianq Chyun IP Office

(57) ABSTRACT

In a method of fabricating a flexible display panel, a rigid substrate is provided. A flexible substrate having a first surface and a second surface opposite to the first surface is provided. A plurality of releasing-regions are formed on the first surface, and bonding strength of an area outside the releasing-regions is greater than bonding strength of the releasing-regions. An adhesive layer is formed between the rigid substrate and the first surface of the flexible substrate. A plurality of display units are formed on the second surface, and each of the display units is located over one of the releasing-regions, respectively. The flexible substrate is patterned to obtain a plurality of flexible carriers, and each of the flexible carriers carries one of the display units, respectively. The flexible carriers and the adhesive layer are de-bonded.

4 Claims, 10 Drawing Sheets

(56) References Cited

FOREIGN PATENT DOCUMENTS

| TW | 200713521 | 4/2007 |
| TW | 200806073 | 1/2008 |
| TW | 200837954 | 9/2008 |

* cited by examiner

FLEXIBLE DISPLAY PANEL AND METHOD OF FABRICATING THE SAME

CROSS-REFERENCE TO RELATED APPLICATION

This application claims the priority benefit of Taiwan application serial no. 99120612, filed Jun. 24, 2010. The entirety of the above-mentioned patent application is hereby incorporated by reference herein and made a part of this specification.

BACKGROUND OF THE INVENTION

1. Field of the Present Invention

The present invention relates generally to a display panel and a method of fabricating the same, and particularly to a flexible display panel and a method of fabricating the same.

2. Description of Related Art

With the progress in the optoelectronic techniques and the semiconductor manufacturing techniques, flat panel displays characterized by high definition, optimal space utilization, low power consumption, and no radiation have gradually tended to be the mainstream products of the market.

A flexible display panel featuring compactness, great impact endurance, flexibility, wearability, and portability has been one of the leading display panels at present. However, in the contemporary technology of forming the flexible display panel, how to form a thin-film-transistor (TFT) array on a flexible substrate is one of the main issues to be resolved.

FIG. 1A to FIG. 1E illustrate a method of fabricating a conventional flexible display panel. With reference to FIG. 1A, FIG. 1B, and FIG. 1C, a rigid substrate 100 is provided, and an organic adhesive material 110 is formed on the rigid substrate 100. A flexible substrate 120 is then disposed on the organic adhesive material 110, and the organic adhesive material 110 is cured by irradiation (e.g. ultraviolet irradiation), such that the flexible substrate 120 is adhered to the rigid substrate 100 through the organic adhesive material 110.

As indicated in FIG. 1D and FIG. 1E, after the flexible substrate 120 is adhered to the rigid substrate 100, a TFT array 130 is formed on the flexible substrate 120. The flexible substrate 120 is removed from the rigid substrate 100 after the TFT array 130 is formed.

Several conventional issues regarding the use of the organic adhesive material 110 are to be resolved. First, the TFT array (e.g. amorphous silicon TFT) is generally formed at a temperature reaching approximately 370° C. at most, whereas the maximum tolerable temperature of the existing organic adhesive material 110 ranges from about 200° C. to about 250° C. Hence, out-gassing phenomenon and decomposition of the organic adhesive material 110 due to pyrolysis and are likely to occur during fabrication of the TFT array 130, and thereby the flexible substrate 120 is warped. Second, the organic adhesive material 110 is vulnerable to chemical solvent, and thus the flexible substrate 120 is warped because of the chemical solvent used for fabricating the TFT array.

To enhance heat resistance and chemical resistance of the organic adhesive material 110, adequate inorganic powder is frequently doped into the organic adhesive material 110 according to the related art, which improves adhesion of the organic adhesive material 110 but causes difficulty in removing the flexible substrate 120 from the rigid substrate 100. As such, while the flexible substrate 120 is being removed from the rigid substrate 100, the TFT array 130 (shown in FIG. 1E) on the flexible substrate 120 is broken.

In addition to doping the inorganic powder into the organic adhesive material 110, photo-sensitive adhesive materials are also employed according to the related art. After fabrication of the TFT array, the photo-sensitive adhesive materials are cured by irradiation, such that the adhesive materials are no longer adhesive, and that the flexible substrate 120 can be removed with ease. However, the applicable photo-sensitive adhesive materials cannot be determined at one's preference because of limited varieties.

SUMMARY OF THE INVENTION

The present invention is directed to a flexible display panel and a method of fabricating the same.

The present invention provides a method of fabricating a flexible display panel. In the method, a rigid substrate is provided. A flexible substrate having a first surface and a second surface opposite to the first surface is provided. A plurality of releasing-regions are formed on the first surface. Here, bonding strength of an area outside the releasing-regions is greater than bonding strength of the releasing-regions. An adhesive layer is formed between the rigid substrate and the first surface of the flexible substrate. A plurality of display units are formed on the second surface, and each of the display units is located over one of the releasing-regions, respectively. The flexible substrate is patterned to obtain a plurality of flexible carriers, each of which carries one of the display units, respectively. The flexible carriers and the adhesive layer are de-bonded.

According to an embodiment of the present invention, the releasing-regions are separated from one another.

According to an embodiment of the present invention, bonding strength between the adhesive layer and the area outside the releasing-regions is greater than bonding strength between the adhesive layer and the releasing-regions.

According to an embodiment of the present invention, the step of forming the adhesive layer between the rigid substrate and the flexible substrate includes forming the adhesive layer on the rigid substrate and adhering the first surface of the flexible substrate onto the adhesive layer.

According to an embodiment of the present invention, each of the flexible carriers is bonded to the adhesive layer through one of the releasing-regions.

According to an embodiment of the present invention, the rigid substrate includes a glass substrate.

According to an embodiment of the present invention, the adhesive layer includes an organic adhesive layer.

According to an embodiment of the present invention, the flexible substrate includes a plastic substrate.

According to an embodiment of the present invention, the flexible substrate includes a water-oxygen-resistant carrier, and the water-oxygen-resistant carrier includes a flexible base film and a water-oxygen-resistant layer bonded to the flexible base film.

According to an embodiment of the present invention, the flexible substrate includes a plurality of water-oxygen-resistant carriers, and each of the water-oxygen-resistant carriers includes a flexible base film and a water-oxygen-resistant layer bonded to the flexible base film.

According to an embodiment of the present invention, a method of forming the releasing-regions includes performing surface treatment on a plurality of partial regions of the first surface with use of plasma or corona to change surface energy of the partial regions.

According to an embodiment of the present invention, the releasing-regions are hydrophobic regions.

According to an embodiment of the present invention, a method of forming the releasing-regions includes forming a plurality of hydrophobic coatings on a plurality of partial regions of the first surface.

According to an embodiment of the present invention, a method of forming the releasing-regions includes forming a plurality of nano-coatings on a plurality of partial regions of the first surface.

According to an embodiment of the present invention, a method of forming the display units includes forming an active device array layer on the second surface and forming a display medium layer on the active device array layer.

According to an embodiment of the present invention, the TFT device includes an a-Si TFT device, an LTPS TFT device, an Oxide-TFT device or an Organic-TFT device.

According to an embodiment of the present invention, the display medium layer includes an electro-phoretic display film, an electro-wetting display film, an organic light emitting diode or an liquid crystal display.

According to an embodiment of the present invention, a method of patterning the flexible substrate includes laser cutting or mechanical cutting.

The present invention further provides a flexible display panel including a flexible carrier and a display unit. The flexible carrier has two surfaces. The display unit is disposed on one of the two surfaces of the flexible carrier, and the other one of the two surfaces of the flexible carrier is a hydrophobic surface.

The present invention further provides a flexible display panel including a flexible carrier, a display unit, and a coating. The flexible carrier has two surfaces. The display unit is disposed on one of the two surfaces of the flexible carrier, and the coating is bonded to the other one of the two surfaces of the flexible carrier. The coating includes a hydrophobic coating or a nano-coating.

According to an embodiment of the present invention, the display unit includes an active device array layer and a display medium layer located on the active device array layer.

According to an embodiment of the present invention, the flexible carrier includes one or more water-oxygen-resistant carriers, and each of the water-oxygen-resistant carriers includes a flexible base film and a water-oxygen-resistant layer bonded to the flexible base film.

According to an embodiment of the present invention, a material of the hydrophobic coating includes organic fluoride, silicon oxide, silicon nitride, metal oxide, and metal nitride.

According to an embodiment of the present invention, a material of the nano-coating includes silicon oxide, silicon nitride, metal oxide, and metal nitride.

According to an embodiment of the present invention, a contact angle of the coating ranges from about 30 degrees to about 150 degrees.

The releasing-regions are formed on the flexible substrate before the adhesive layer and the flexible substrate are bonded according to the present invention. Hence, it is not difficult to improve yield when the flexible display panel and the rigid substrate are de-bonded.

It is to be understood that both the foregoing general descriptions and the following detailed embodiments are exemplary and are, together with the accompanying drawings, intended to provide further explanation of technical features and advantages of the present invention.

BRIEF DESCRIPTION OF THE DRAWINGS

The accompanying drawings are included to provide a further understanding of the present invention, and are incorporated in and constitute a part of this specification. The drawings illustrate embodiments of the present invention and, together with the description, serve to explain the principles of the present invention.

DESCRIPTION OF EMBODIMENTS

First Embodiment

Figure 1A:
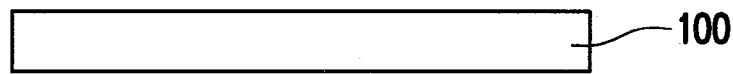
FIG. 1A to FIG. 1E illustrate a method of fabricating a conventional flexible display panel.
Figure 1B:
Figure 1B:
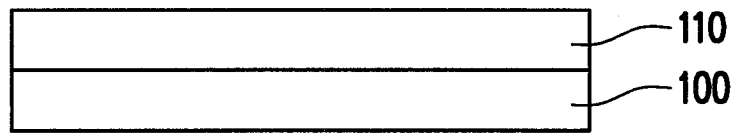
Figure 1C:
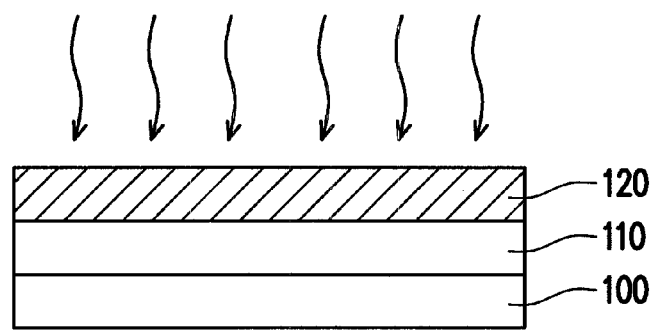
Figure 1D:
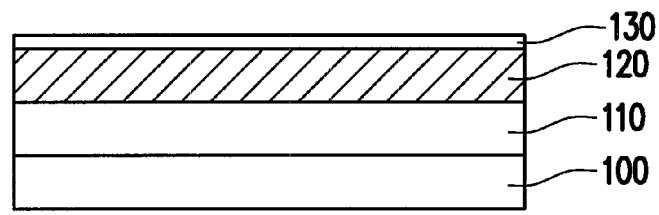
Figure 1E:
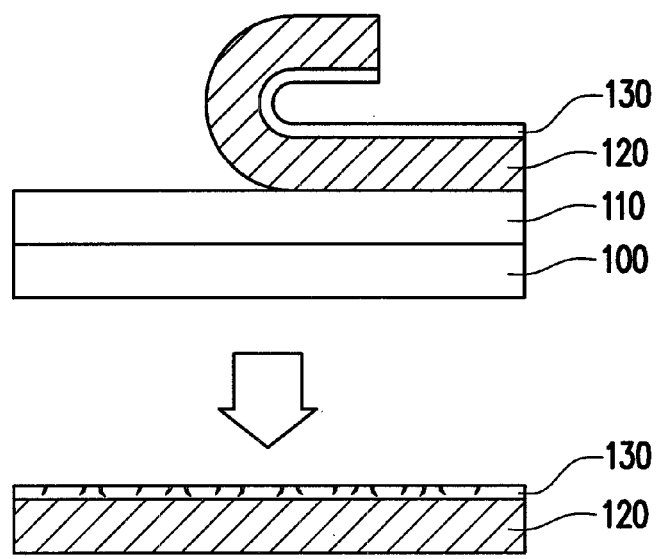
Figure 2:
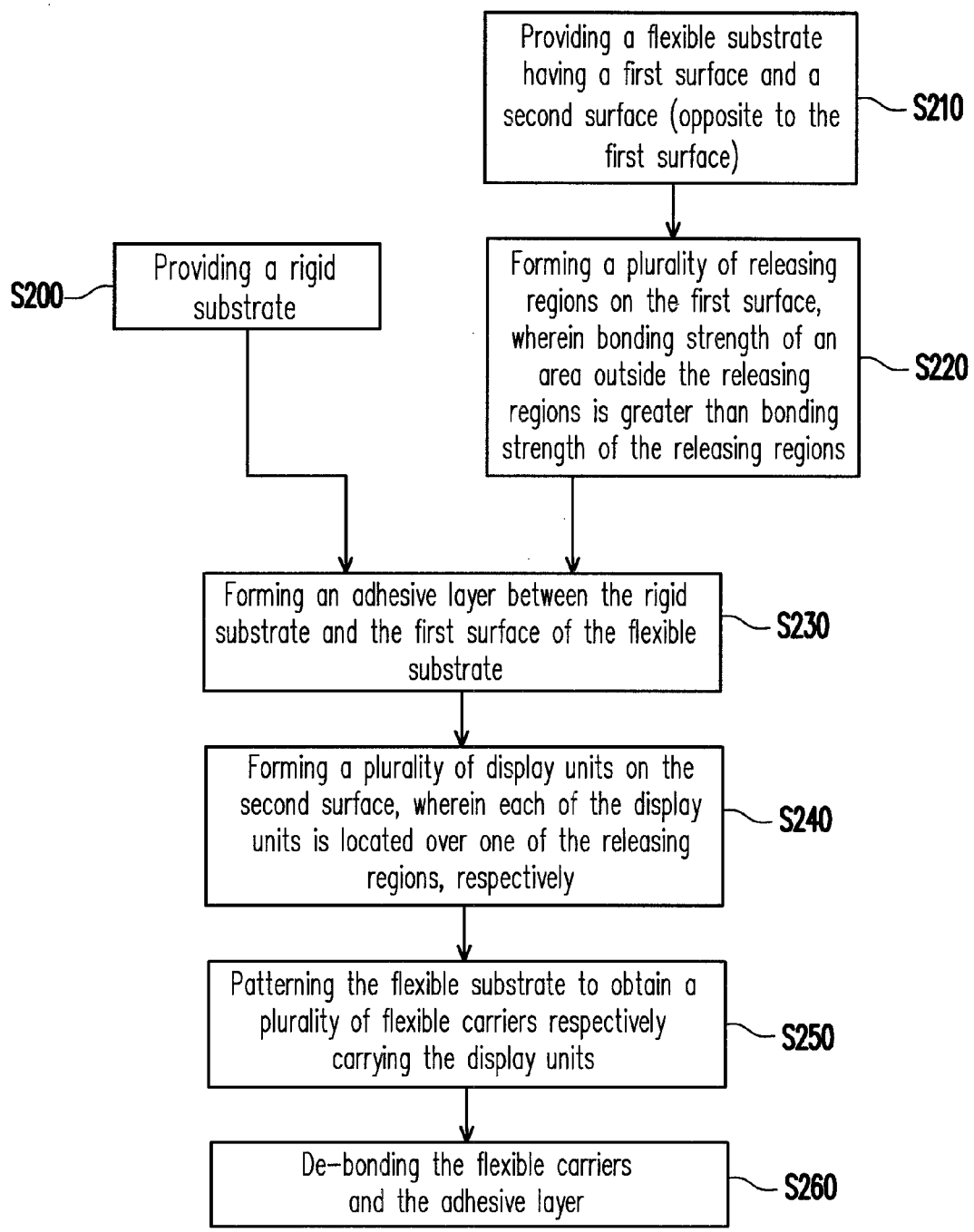
FIG. 2 is a flow chart illustrating a method of fabricating a flexible display panel according to a first embodiment of the present invention.

FIG. 2 is a flow chart illustrating a method of fabricating a flexible display panel according to a first embodiment of the present invention. As shown in FIG. 2, in a method of fabricating a flexible display panel according to this embodiment, a rigid substrate is provided (step S200). A flexible substrate having a first surface and a second surface opposite to the first surface is provided (step S210). A plurality of releasing-regions are formed on the first surface. Here, bonding strength of an area outside the releasing-regions is greater than bonding strength of the releasing-regions (step S220). An adhesive layer is formed between the rigid substrate and the first surface of the flexible substrate (step S230). A plurality of display units are formed on the second surface, and each of the display units is located over one of the releasing-regions, respectively (step S240). The flexible substrate is patterned to obtain a plurality of flexible carriers, each of which carries one of the display units, respectively (step 250). The flexible carriers and the adhesive layer are de-bonded (step S260). Note that the sequence of performing the steps S200, S210, and S220 can alter at will. For instance, the step S200 can be carried out before the steps S210 and S220 are performed. Alternatively, the steps S210 and S220 can be certainly performed before the step S200 is implemented.

The method of fabricating the flexible display panel is elaborated hereinafter with reference to FIG. 3A to FIG. 3F, FIG. 4, and FIG. 5A to FIG. 5C.

Figure 3A:
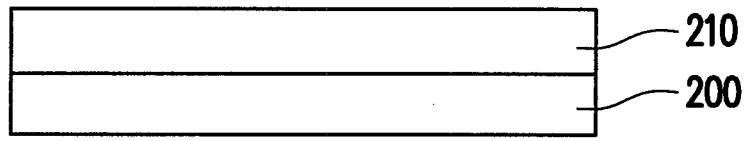
FIG. 3A to FIG. 3F are schematic cross-sectional views illustrating the method of fabricating the flexible display panel according to the first embodiment of the present invention.

FIG. 3A to FIG. 3F are schematic cross-sectional views illustrating the method of fabricating the flexible display panel according to the first embodiment of the present invention. FIG. 4 is a schematic top view illustrating a flexible substrate having releasing-regions. As indicated in FIG. 2 and FIG. 3A, a rigid substrate 200 is provided (step S200), and an adhesive layer 210 is formed on the rigid substrate 200. In this embodiment, the rigid substrate 200 is made of glass or other appropriate materials, for instance, and the adhesive layer 210 is, for instance, an organic adhesive layer made of a thermal curable adhesive material or a light curable adhesive material. For example, the adhesive layer 210 is made of an ultraviolet curable adhesive material, an infrared curable adhesive material, and so forth.

Figure 3B:
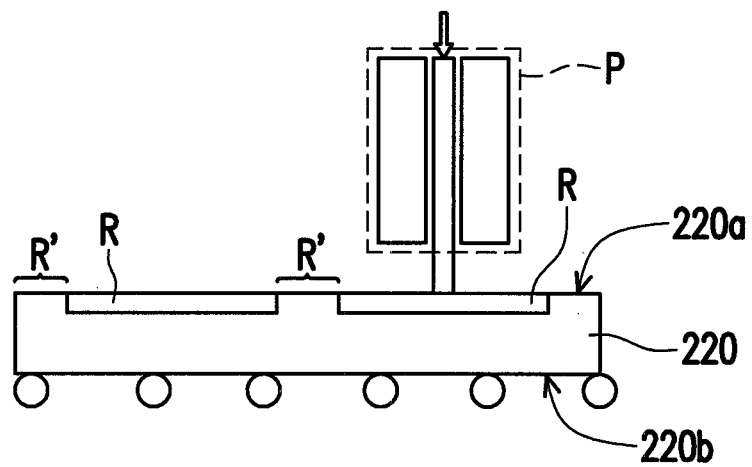
Figure 4:
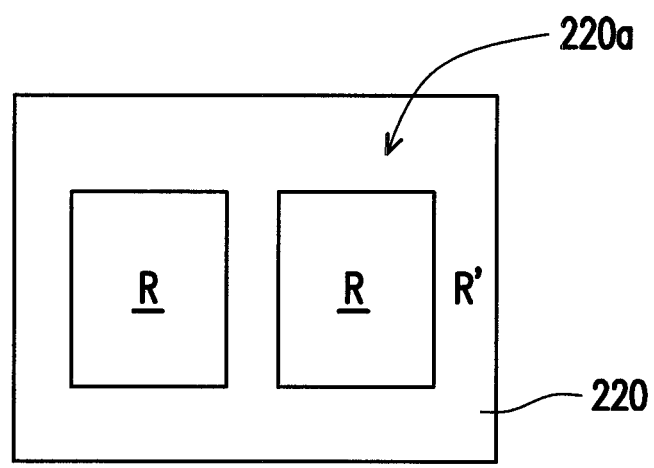
FIG. 4 is a schematic top view illustrating a flexible substrate having releasing-regions.

As shown in FIG. 2, FIG. 3B, and FIG. 4, a flexible substrate 220 having a first surface 220a and a second surface 220b opposite to the first surface 220a is provided (step S210).

In this embodiment, the flexible substrate 220 is a plastic substrate or another substrate made of an appropriate material, for example. A plurality of releasing-regions R are then formed on the first surface 220a of the flexible substrate 220. Bonding strength of an area R' outside the releasing-regions R is greater than bonding strength of the releasing-regions R (step S220). Note that the adhesive layer 210 is formed on the rigid substrate 200 according to this embodiment, whereas the adhesive layer 210 can also be formed on the flexible substrate 220 having the releasing-regions R in other embodiments. To be more specific, the releasing-regions R can be formed on the first surface 220a of the flexible substrate 220, and then the adhesive layer 210 is formed on the first surface 220a of the flexible substrate 220. The location where the adhesive layer 210 is formed and the timing at which the adhesive layer 210 is formed are not limited to be those depicted in FIG. 3A.

For instance, the releasing-regions R are separated from one another. The adhesive layer 210 is often made of a hydrophilic material. Hence, when the adhesive layer 210 is an organic adhesive layer, the releasing-regions R are configured to be hydrophobic regions in order to well separate the releasing-regions R from the adhesive layer 210 in the subsequent processes. In this embodiment, surface treatment can be performed on a plurality of partial regions of the first surface 220a with use of plasma or corona P, so as to change surface energy of the partial regions. As such, the partial regions can be the hydrophobic releasing-regions R.

Figure 3C:
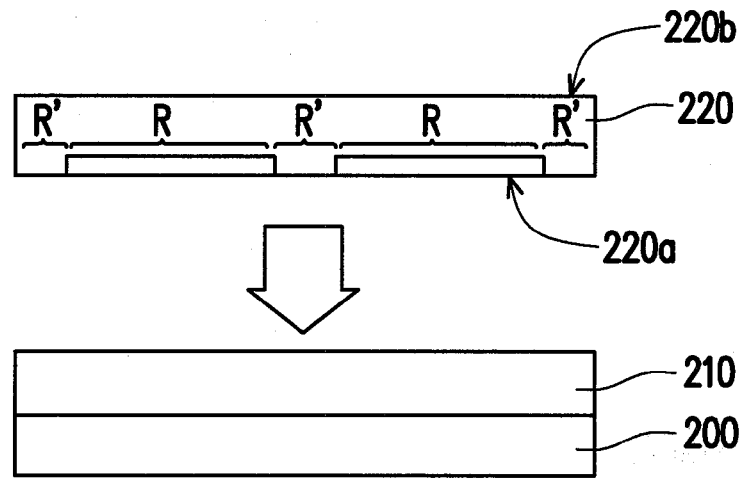

With reference to FIG. 2 and FIG. 3C, the first surface 220a of the flexible substrate 220 faces toward the rigid substrate 200, such that the adhesive layer 210 is disposed between the rigid substrate 200 and the first surface 220a of the flexible substrate 220 (step S230). After proper alignment, the flexible substrate 220 comes into contact with the adhesive layer 210 to adhere the flexible substrate 220 onto the rigid substrate 200 through the adhesive layer 210. According to this embodiment, bonding strength between the adhesive layer 210 and the area R' outside the releasing-regions R is greater than bonding strength between the adhesive layer 210 and the releasing-regions R.

Figure 3D:
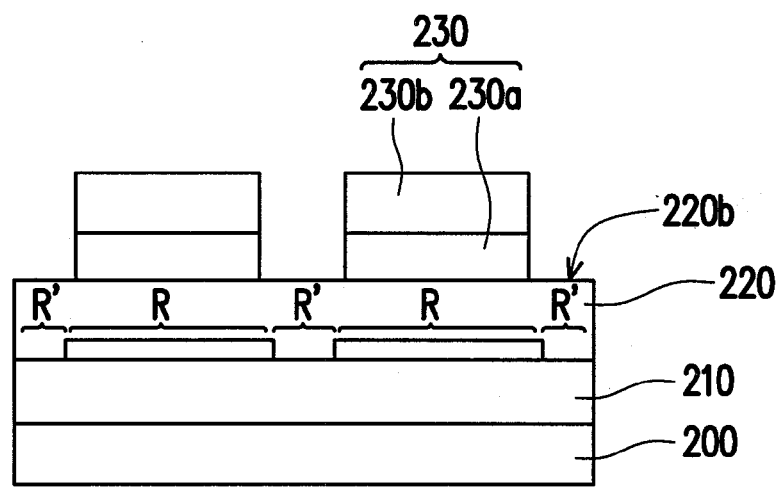

As indicated in FIG. 2 and FIG. 3D, a plurality of display units 230 are formed on the second surface 220b of the flexible substrate 220, and each of the display units 230 is located over one of the releasing-regions R, respectively (step S240). According to this embodiment, a method of forming the display units 230 includes forming an active device array layer 230a on the second surface 220b of the flexible substrate 220 and forming a display medium layer 230b on the active device array layer 230a. For instance, the display medium layer 230a of this embodiment is an electro-phoretic display film, an electro-wetting display film, or a display medium in other forms, an organic light emitting diode or an liquid crystal display. Active device array layer 230a includes, for example, TFT devices such as a-Si TFT devices, LTPS TFT devices, Oxide-TFT devices or Organic-TFT devices.

Figure 3E:
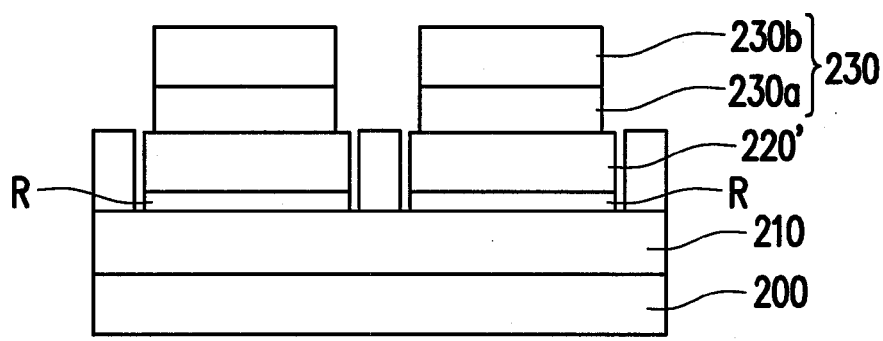

With reference to FIG. 2 and FIG. 3E, after the display units 230 are formed, the flexible substrate 220 is patterned (as shown in FIG. 3D) to obtain a plurality of flexible carriers 220' respectively carrying the display units 230 (step S250). According to this embodiment, a method of patterning the flexible substrate 220 includes laser cutting or mechanical cutting. It is clearly depicted in FIG. 3E that one surface (i.e. the bottom surface) of the flexible carrier 220' has one releasing-region R, and the other surface (i.e. the top surface) of the flexible carrier 220' has one display unit 230. Here, each of the flexible carriers 220' comes into contact with the adhesive layer 210 through one of the releasing-regions R.

Figure 3F:
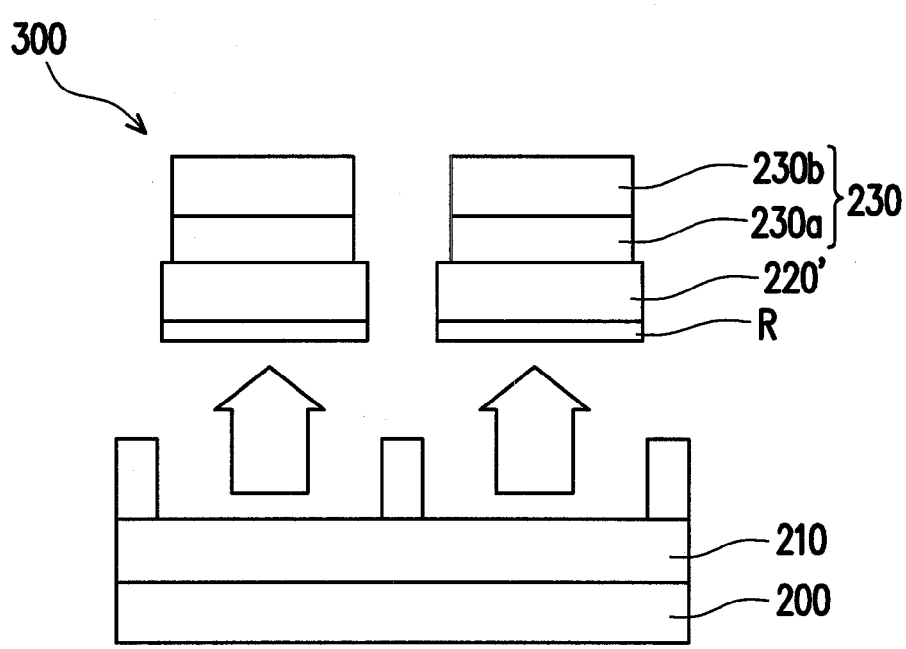

As indicated in FIG. 2 and FIG. 3F, the flexible carriers 220' and the adhesive layer 210 are de-bonded (step S260), and a flexible display panel 300 is initially formed. Each of the flexible carriers 220' comes into contact with the adhesive layer 210 through one of the releasing-regions R, and the bonding strength between the adhesive layer 210 and the releasing-regions R is relatively insignificant. Accordingly, the flexible carriers 220' can be easily separated from the adhesively layer 210, and damages to the display units 230 are rather unlikely.

As shown in FIG. 3F, the flexible display panel 300 of this embodiment includes a flexible carrier 220' and a display unit 230. Here, the flexible carrier 220 has two surfaces. The display unit 230 is disposed on one of the two surfaces of the flexible carrier 220', and the other one of the two surfaces of the flexible carrier 220' is a hydrophobic surface (i.e. the hydrophobic releasing-regions R).

Figure 5A:
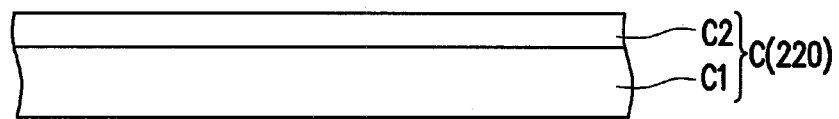
FIG. 5A to FIG. 5C are schematic cross-sectional views illustrating a flexible substrate having different configurations.
Figure 5B:
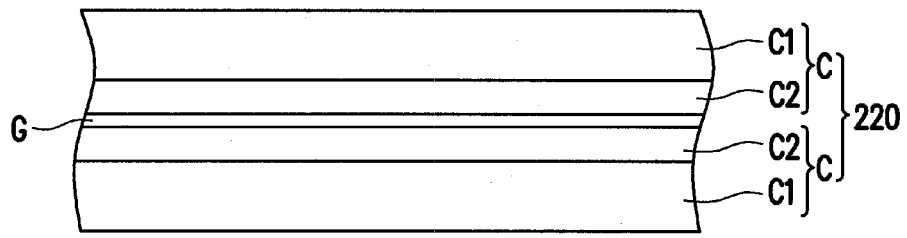
Figure 5C:
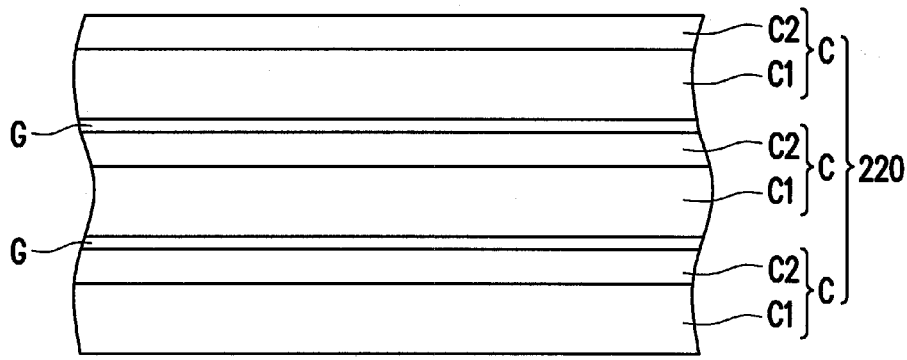

FIG. 5A to FIG. 5C are schematic cross-sectional views illustrating a flexible substrate having different configurations. With reference to FIG. 5A to FIG. 5C, the flexible substrate 220 having different configurations can be applied to various products according to this embodiment. For instance, the flexible substrate 220 can include a water-oxygen-resistant carrier C (as shown in FIG. 5A) or a plurality of water-oxygen-resistant carriers C (as shown in FIG. 5B and FIG. 5C). Each of the water-oxygen-resistant carriers C includes a flexible base film C1 and a water-oxygen-resistant layer C2 bonded to the flexible base film C1. When the flexible substrate 220 is comprised of the water-oxygen-resistant carriers C, the water-oxygen-resistant carriers C are bonded to one another through an adhesive material G, for example.

Second Embodiment

Figure 6A:
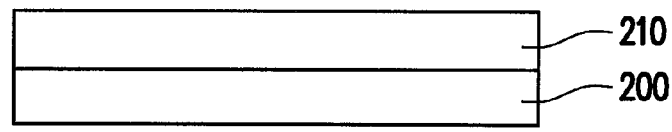
FIG. 6A to FIG. 6E are schematic cross-sectional views illustrating a method of fabricating a flexible display panel according to a second embodiment of the present invention.
Figure 6B:
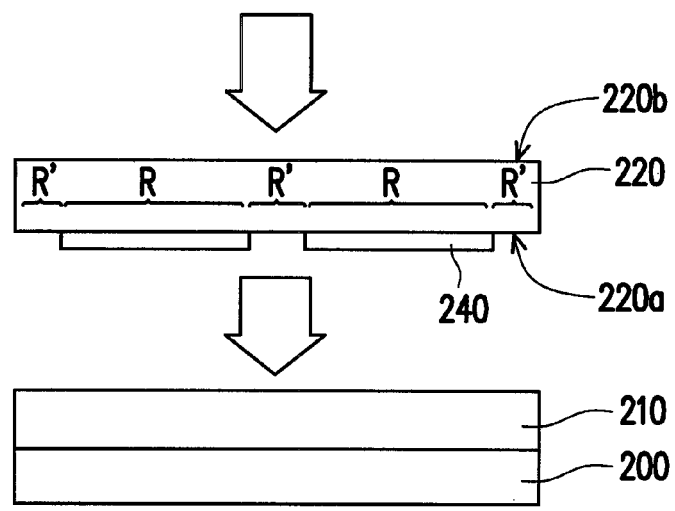
Figure 6C:
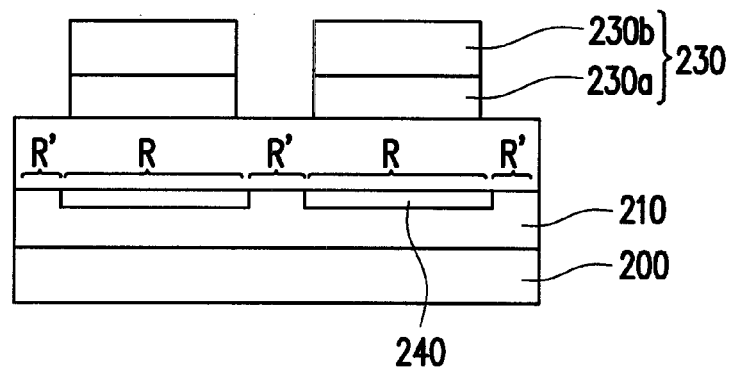
Figure 6D:
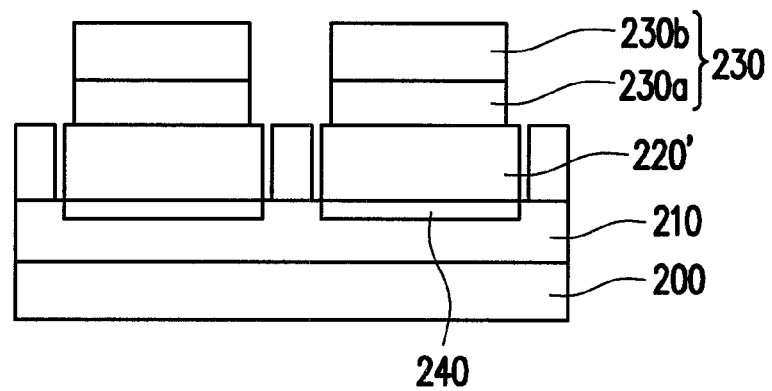
Figure 6E:
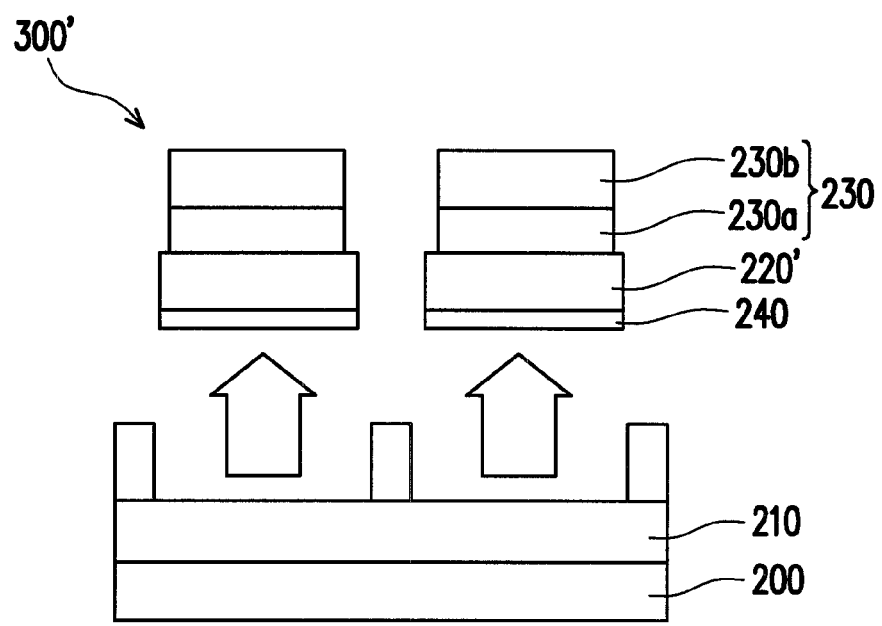

FIG. 6A to FIG. 6E are schematic cross-sectional views illustrating a method of fabricating a flexible display panel according to a second embodiment of the present invention. The method of fabricating the flexible display panel in this embodiment as shown in FIG. 6A and FIG. 6E is similar to that described in the first embodiment, while the main difference therebetween rests in the method of forming the releasing-regions R. In particular, the method of forming the releasing-regions R in this embodiment includes forming a plurality of hydrophobic coatings or nano-coatings 240 on a plurality of partial regions of the first surface 220a.

In FIG. 6E, the flexible display panel 300' of this embodiment includes a flexible carrier 220', a display unit 230, and a coating 240. The flexible carrier 220' has two surfaces. The display unit 230 is disposed on one of the two surfaces of the flexible carrier 220', and the coating 240 is bonded to the other one of the two surfaces of the flexible carrier 220'. The coating 240 includes a hydrophobic coating or a nano-coating. In this embodiment, a contact angle of the coating 240 ranges from about 30 degrees to about 150 degrees, for example.

When the coating 240 is a hydrophobic coating, for instance, a material of the coating 240 includes organic fluoride, silicon oxide, silicon nitride, metal oxide, and metal nitride; when the coating 240 is a nano-coating, for instance, a material of the coating 240 includes silicon oxide, silicon nitride, metal oxide, and metal nitride.

According to the present invention, the releasing-regions (on which surface treatment is performed or coatings are formed) are formed on the flexible substrate before the adhesive layer and the flexible substrate are bonded. Hence, it is not difficult to improve yield when the flexible display panel and the rigid substrate are de-bonded.

It will be apparent to those skilled in the art that various modifications and variations can be made to the structure of the present invention without departing from the scope or spirit of the present invention. In view of the foregoing, it is intended that the present invention cover modifications and variations of the present invention provided they fall within the scope of the following claims and their equivalents.

What is claimed is:

1. A flexible display panel comprising:
   a flexible carrier having two surfaces, wherein the flexible carrier comprises a plurality of water-oxygen-resistant flexible carriers bonded to one another through an adhesive material, and each of the water-oxygen-resistant flexible carriers comprises:
      a flexible base film; and
      a water-oxygen-resistant layer bonded to the flexible base film, wherein the adhesive material contacts and is located between the water-oxygen-resistant layer of one of the water-oxygen-resistant flexible carriers and the flexible base film of another one of the water-oxygen-resistant flexible carriers;
   a display unit disposed on and contacting the outmost water-oxygen-resistant layer of the flexible carrier, wherein the display unit comprises:
      an active device array layer; and
      a display medium layer located on the active device array layer; and
   a coating formed on and contacting the outmost flexible base film of the flexible carrier, wherein a material of the coating comprises organic fluoride.

2. The flexible display panel as claimed in claim 1, wherein the active device array layer of the display unit contacts the outmost water-oxygen-resistant layer of the flexible carrier and is located between the display medium layer of the display unit and the flexible carrier, the coating contacts the outmost flexible base film of the flexible carrier, and the flexible carrier is located between the display medium layer of the display unit and the coating.

3. A flexible display panel comprising:
   a flexible carrier having two surfaces, wherein the flexible carrier comprises a plurality of water-oxygen-resistant flexible carriers bonded to one another through an adhesive material, and each of the water-oxygen-resistant flexible carriers comprises:
      a flexible base film; and
      a water-oxygen-resistant layer bonded to the flexible base film, wherein the adhesive material contacts and is located between the water-oxygen-resistant layer of one of the water-oxygen-resistant flexible carriers and that of another one of the water-oxygen-resistant flexible carriers;
   a display unit disposed on and contacting the outmost flexible base film of the flexible carrier, wherein the display unit comprises:
      an active device array layer; and
      a display medium layer located on the active device array layer; and
   a coating formed on and contacting another outmost flexible base film of the flexible carrier, wherein a material of the coating comprises organic fluoride.

4. The flexible display panel as claimed in claim 3, wherein all of the water-oxygen-resistant layers are located between the outmost flexible base film and the another outmost flexible base film of the flexible carrier.

* * * * *